United States Patent [19]

Jackson et al.

[11] Patent Number: 4,964,920

[45] Date of Patent: Oct. 23, 1990

[54] METHOD OF REMOVING DEPOSITS OF TIN, LEAD OR TIN/LEAD ALLOYS FROM COPPER SUBSTRATES AND COMPOSITIONS FOR USE THEREIN

[75] Inventors: Brian Jackson, Bourne End; Gary Barnett, Slough, both of England

[73] Assignee: Imasa Limited, Slough Berks, United Kingdom

[21] Appl. No.: 451,054

[22] Filed: Dec. 15, 1989

[51] Int. Cl.$^5$ .................. C23G 1/02; C09K 13/06
[52] U.S. Cl. ............................. 134/3; 134/41; 252/79.4
[58] Field of Search .................. 252/79.4; 134/3, 41

[56] References Cited

U.S. PATENT DOCUMENTS

| | | | |
|---|---|---|---|
| 4,306,933 | 12/1981 | Da Foute | 252/79.4 |
| 4,374,744 | 2/1983 | Kawanabe | 252/79.4 |
| 4,713,144 | 12/1987 | Schiller | 252/79.4 |

Primary Examiner—Asok Pal
Assistant Examiner—Ourmazd S. Ojan
Attorney, Agent, or Firm—Richard P. Mueller

[57] ABSTRACT

A composition for removing a layer of tin, lead or tin/lead alloy from a copper substrate such as a printed circuit board comprises an aqueous solution of nitric acid and ferric acid and also contains anthranilic acid to inhibit the degree of attack on the copper substrate. A surfactant, such as a mixture of cocoamine and an ethoxylated fatty alcohol or a mixture of a phosphate ester and an ethylene oxide/propylene oxide copolymer, may also be present to improve the brightness of the remaining copper.

13 Claims, No Drawings

METHOD OF REMOVING DEPOSITS OF TIN, LEAD OR TIN/LEAD ALLOYS FROM COPPER SUBSTRATES AND COMPOSITIONS FOR USE THEREIN

The present invention relates to a method of removing a deposit of tin or lead or tin/lead alloys from a copper substrate. The present invention further relates to compositions suitable for use in such a method. One particular application of the present invention is in the removal of a solder film from a copper substrate on a printed circuit board and also to the removal of a film of tin-copper alloy formed at the junction between the solder film and the copper substrate.

A typical manufacturing process for printed circuit boards includes the step of providing a film of solder in a predetermined pattern onto a copper substrate of a circuit board to act as a resist layer during a subsequent copper etching step. Typically, the solder is applied onto the copper substrate by an electroplating technique to give a film having a typical thickness of about 0.008 mm. Subsequent to a copper etching step, it is typical for the solder deposits on a printed circuit board to be subjected to a reflowing operation whereby they are melted for instance in hot oil or by the application of IR radiation. Upon solidification the deposits have a bright metallic finish. This reflowing operation therefore improves the appearance of the deposits and the shelf-life of the product. During the reflowing operation, a thin film of tin-copper alloy forms at the junction of the solder and the copper substrate. Subsequently it will be desired to remove the solder film, and the thin film of tin-copper alloy, to expose the copper substrate in the predetermined pattern. For practical and economic reasons, it is desirable to strip both the solder film and the tin-copper alloy film off the copper substrate on a printed circuit board in a single step. Such a single step procedure and composition for use therein is disclosed in EP-A-No. 0257792. According to that document a composition comprising an aqueous solution of nitric acid, ferric nitrate and sulphamic acid can be used to remove solder and tin-copper alloy films from a copper substrate in a single step. During use of that composition, the sulphamic acid serves to inhibit the attack on the copper substrate by the other components after the solder film and the tin-copper alloy film have been removed. However, some attack of the copper substrate can still occur. We have found that by using a composition containing anthranilic acid as inhibitor, the degree of attack on the copper substrate can be reduced.

Accordingly, the present invention provides a composition for removing a layer of a metal selected from tin, lead and tin-lead alloy from a copper substrate comprising an aqueous solution of nitric acid and ferric nitrate characterised in that the solution also contains anthranilic acid.

The present invention also provides a method of stripping a layer of a metal selected from tin, lead and tin-lead alloy from a copper substrate which comprises applying to said layer to be stripped a composition comprising an aqueous solution of nitric acid and ferric nitrate characterised in that the solution also contains anthranilic acid.

The composition and the method of the invention are useful for stripping deposits of tin, lead or tin-lead alloys from the surfaces of copper or copper alloy substrates on which the deposits were previously formed, such as by electrodeposition. The invention has particular application in, though it is not restricted to, the stripping of a film of solder from a copper substrate on a printed circuit board and, where it exists, a film of tin-copper intermetallic alloy at the solder-copper substrate junction. The invention will further be described with reference to its use in the stripping of solder films.

The nitric acid is present in the composition used in the method in an amount sufficient to dissolve the solder. Nitric acid is readily available commercially as a 69% by weight aqueous solution having a specific gravity of 1.42. For convenience, all volume concentrations of nitric acid that are stated herein refer to volume concentrations of 69% by weight aqueous solution of nitric acid. Typically, the amount of this nitric acid used in the composition of the invention will be not less than 100 ml/l since lower concentrations will strip the solder at rates which are too low to be commercially useful. The upper limit for the concentration of nitric acid in the composition is typically about 300 ml/l, since at higher concentrations the slight increase in solder stripping rate obtained is outweighed by other considerations such as the cost and the increased hazard of using a corrosive substance. Preferably, the concentration of nitric acid used in the composition of the invention is in the range of from 150 to 250 ml/l, measured as 69% nitric acid aqueous solution and most preferably about 200 ml/l.

Ferric nitrate is obtainable commercially in the form of the hydrate $Fe(NO_3)_3.9H_2O$. For convenience, all concentrations of ferric nitrate stated herein are concentrations of the nonahydrate. The ferric nitrate is present in the composition of the invention in an amount sufficient to dissolve the layer of tin-copper alloy overlying the copper substrate of the circuit board. Typically, the ferric nitrate nonahydrate will be used in the composition of the invention at a concentration in the range of from 30 to 140 g/l since at concentrations below about 30 g/l the rate of removal of the tin-copper alloy film from the copper substrate will be too slow for commercial purposes. In addition, in our experience, there are no worthwhile benefits obtained by using a concentration of ferric nitrate greater than about 140 g/l. Preferably, the ferric nitrate concentration in the composition of the invention will be within the range of from 50 to 100 g/l since within this range we find that a good balance of high rate of attack on the tin-copper alloy film and low rate of attack on the copper substrate is achieved. Most preferably, the ferric nitrate concentration in the composition of the invention will be about 80 g/l.

The solder which can be stripped by application of the composition of the invention includes the various tin-lead alloy solders, substantially pure lead solders and also substantially pure tin solders. Such solders are conventionally used for providing resist films on copper substrates of printed circuit boards. The removal of the solder by the nitric acid in the composition of the invention involves a reaction between the nitric acid and the metals tin and lead of the solder. After dissolution of the solder film by the nitric acid, the exposed film of intermetallic tin-copper alloy is attacked and removed by the ferric nitrate in the composition leaving the surface of the copper substrate exposed. This copper surface is, of course, vulnerable to chemical attack by both the nitric acid and the ferric nitrate in the composition. However, by incorporating anthranilic acid (i.e. o-aminobenzoic acid) in the composition, the chemical attack on the exposed copper surface can be reduced. The anthranilic acid should be present in the composition of the invention in an amount effective to inhibit any etching of the pure copper surface. Typically, the anthranilic acid will be present in the composition of the invention at a concentration in the range of from 1 to 30 g/l and preferably in the range of from 5 to 20 g/l. We have found that a good inhibiting effect is achieved at an anthranilic acid concentration of about 10 g/l.

It is further within the scope of the invention to incorporate other materials into the composition which do not significantly reduce the activity. For instance, it is possible to incorporate one or more conventional tarnish inhibitors such as benzotriazole or tolyltriazole to produce a clean and bright finish on the surface of the exposed copper substrate after stripping. It is also possible to include a surfactant or wetting agent to improve the wetting characteristic of the composition. In this respect, however, we have discovered that unexpected advantages are obtained if an amount of each of two different surfactants is incorporated into the composition. We found that if an amount of either cocoamine or a non-ionic ethoxylated fatty alcohol is incorporated into the composition of the invention no significant change in the result is obtained. However, if both types of surfactants are incorporated it is found that the final copper surface after stripping is rendered bright and shiny and that the inhibition of chemical attack of the copper surface by the nitric acid/ferric nitrate in the composition is enhanced. Neither of these advantages were obtained when only one of the surfactants was present in the stripping composition. Accordingly, in a preferred embodiment the present invention provides a composition for removing a layer of metal selected from tin, lead and tin/lead alloy and/or for example for removing a solder layer and a layer of underlying tin-copper alloy from a copper substrate (for example of a printed circuit board) comprising an aqueous solution of nitric acid and ferric nitrate characterised in that the solution further contains anthranilic acid, cocoamine and a non-ionic surfactant comprising a polyethoxylated unbranched fatty alcohol.

A suitable cocoamine surfactant is available as ARMEEN CD ("ARMEEN" is a registered Trade Mark) and a suitable polyethoxylated fatty alcohol non-ionic surfactant is available as PLUROFAC LF 403 ("PLUROFAC" is a registered Trade Mark).Typically, the ARMEEN CD surfactant will be used at a concentration in the range of from 0.1 to 5.0 g/l and preferably from 0.2 to 0.75 g/l. The PLUROFAC LF 403 surfactant will, in general, be used at a concentration within the range of from 0.1 to 5.0 g/l and preferably from 0.5 to 1.5 g/l. Preferably, each of the two surfactants will be added to the aqueous solution of nitric acid, ferric nitrate and anthranilic acid separately, each as a solution in methanol.

According to a preferred embodiment, the composition of the invention has the following formulation:

| hydrated ferric nitrate | 80 g/l |
| anthranilic acid | 10 g/l |
| nitric acid (69%) | 200 ml/l |
| PLUROFAC LF 403 | 0.64 g/l |
| ARMEEN CD | 0.37 g/l |
| WATER | to make 1 liter |

We have also found that good results are obtained with an ethylene oxide/propylene oxide copolymer surfactant and/or with a phosphate ester. Accordingly, in a further preferred embodiment, the invention provides a composition for removing a layer of a metal selected from tin, lead and tin/lead alloy from a copper substrate comprising an aqueous solution of nitric acid, ferric nitrate and anthranilic acid and wherein the composition further comprises a phosphate ester and/or an ethylene oxide/propylene oxide co-polymer. It is preferred that both the phosphate ester and the ethylene oxide/propylene oxide copolymer be present.

A suitable blend of phosphate ester and ethylene oxide/propylene oxide copolymer is available under the trade mark VERSILAN MX123. Typically, the VERSILAN MX123 blend will be used at a concentration in the range of from 0.5 to 10 g/l and preferably from 1 to 5 g/l. As the VERSILAN MX123 blend is more water soluble than the ARMEEN CD and PLUROFAC LF 403 products referred to above, it need not be dissolved in methanol but instead can be added direct to the aqueous composition.

According to a further preferred embodiment, the composition of the invention has the following formulation:

| ferric nitrate nonahydrate | 140 g/l |
| anthranilic acid | 10 g/l |
| nitric acid (69%) | 300 ml/l |
| VERSILAN MX123 | 3 g/l |
| water | to make 1 liter |

In a typical commercial installation, the circuit boards to be treated with the stripping composition will be contacted with the stripping composition, for instance by dipping or spraying, and contact will be maintained for a period of time sufficient for complete removal of the solder film and tin-copper intermetallic alloy film. The stripping solution, to be effective, does not require heating and, at the time of use, will have a temperature typically in the range of from 10° to 50° C., more typically from 20° to 25° C. Contact between the stripping solution and the circuit board to be treated will obviously depend on the thickness of the solder film and tin-copper alloy film to be removed. In general the contact time will be in the range of from about 0.5 to about 3 minutes, but more usually about 1 minute.

EXAMPLES

EXAMPLE 1

An aqueous solution was prepared having the following formulation:

| nitric acid (69%) | 300 ml/l |
| ferric nitrate nonahydrate | 140 g/l |
| anthranilic acid | 30 g/l |

The solution was tested at room temperature on a 60/40 tin/lead anode for 1 minute to determine the tin/lead strip rate and on a cleaned copper laminate for 4 minutes to determine the copper etch rate. The results were as follows:

| Tin/Lead Strip Rate | Copper Etch Rate |
| --- | --- |
| 12 microns/minute | 0.9 microns/4 minutes |

After the copper etch, the surface on the copper substrate was dull and dark.

EXAMPLE 2

An aqueous solution was prepared having the following formulation:

| | |
|---|---|
| nitric acid (69%) | 300 ml/l |
| ferric nitrate nonahydrate | 140 g/l |
| anthranilic acid | 10 g/l |
| PLUROFAC LF 403 | 0.64 g/l |
| ARMEEN CD | 0.37 g/l |

The solution was tested as in Example 1 above to determine the tin/lead strip rate and the copper etch rate. The results were as follows:

| Tin/Lead Strip Rate | Copper Etch Rate |
|---|---|
| 6.6 microns/minute | 0.35 microns/4 minutes |

After the copper etch, the surface on the copper substrate was bright and shiny.

EXAMPLE 3

Aqueous solutions having the following formulations were prepared.

| | | |
|---|---|---|
| A. | (comparative). | |
| | nitric acid (69%) | 300 ml/l |
| | hydrated ferric nitrate | 140 g/l |
| | sulphamic acid | 50 g/l |
| B. | (comparative). | |
| | as A above but also containing 0.35 g/l benzotriazole | |
| C. | nitric acid (69%) | 200 ml/l |
| | hydrated ferric nitrate | 80 g/l |
| | anthranilic acid | 10 g/l |
| D. | as c above but also containing 0.37 g/l of ARMEEN CD AND 0.64 g/l of PLUROFAC LF 403 | |

Each of the solutions A-D above was tested as in Example 1 above. The results were as follows:

| Treatment Solution | Tin/Lead Stripping Rate (microns/minute) | Copper Etch Rate (microns/4 minutes) | Appearance of Cu surface after etch |
|---|---|---|---|
| A | 16.2 | 0.9 | dull |
| B | 12.0 | 12.0 | dull |
| C | 13.7 | 0.65 | lighter colour |
| D | 8.6 | 0.2 | bright, shiny |

EXAMPLE 4

A number of aqueous solutions containing 200 ml/l nitric acid (69%), 10 g/l anthranilic acid, 0.37 g/l ARMEEN CD, 0.64 g/l PLUROFAC LF 403 and varying concentrations of ferric nitrate nonahydrate were prepared and tested as in Example 1 above. The rate of tin lead stripping and the rate of copper etching were determined for each stripping solution under test. The results are shown in Table 1.

TABLE 1

| Ferric Nitrate (g/l) | Strip Rate (microns/minute) | Etch Rate (microns/4 minutes) |
|---|---|---|
| 30 | 8.6 | 0.01 |
| 80 | 8.6 | 0.2 |
| 100 | 8.2 | 0.25 |
| 140 | 7.8 | 0.2 |

EXAMPLE 5

A number of aqueous solutions containing 80 g/l Fe(NO$_3$)$_3$.9H$_2$O, 200 ml/l nitric acid (69%), 0.37 g/l ARMEEN CD, 0.64 g/l PLUROFAC LF 403 and varying concentrations of anthranilic acid were prepared and tested as in Example 1 above. The rate of tin/lead stripping and the rate of copper etching were determined for each stripping solution under test. The results are shown in Table 2.

TABLE 2

| Anthranilic Acid (g/l) | Strip Rate (microns/minute) | Etch Rate (microns/4 minutes) |
|---|---|---|
| 1 | 7.8 | 0.22 |
| 10 | 8.6 | 0.2 |
| 20 | 6.0 | 0.14 |
| 30 | 7.6 | 0.23 |

EXAMPLE 6

A number of aqueous solutions containing 80 g/l Fe(NO$_3$)$_3$.9H$_2$O, 10 g/l anthranilic acid, 0.37 g/l ARMEEN CD, 0.64 g/l PLUROFAC LF 403 and varying concentrations of nitric acid were prepared and tested as in Example 1 above. The rate of tin/lead stripping and the rate of copper etching were determined for each stripping solution under test. The results are shown in Table 3.

TABLE 3

| Nitric Acid (ml/l) (69%) | Strip Rate (microns/minute) | Etch Rate (microns/4 minutes) |
|---|---|---|
| 100 | 2.8 | 0.14 |
| 200 | 8.6 | 0.2 |
| 300 | 7.2 | 0.3 |

EXAMPLE 7

An aqueous solution was prepared having the following formulation:

| | |
|---|---|
| nitric acid (69%) | 300 ml/l |
| ferric nitrate nonahydrate | 140 g/l |
| anthranilic acid | 10 g/l |
| VERSILAN MX123 | 3 g/l |

The solution was tested as in Example 1 above to determine the tin/lead strip rate and the copper etch rate. The results were as follows:

| Tin/Lead Strip Rate | Copper Etch Rate |
|---|---|
| 8.5 microns/minute | 0.35 microns/4 minutes |

After the copper etch, the surface on the copper substrate was bright and shiny.

What is claimed is:

1. A composition for removing a layer of a metal selected from the group consisting of tin, lead and tin/lead alloy from a copper substrate, said composition comprising an aqueous solution of nitric acid and ferric nitrate wherein said solution also contains anthranilic acid.

2. The composition of claim 1, wherein said aqueous solution comprises from about 100 to about 300 ml/l of nitric acid measured as 69% by weight aqueous nitric acid solution, from about 30 to about 140 g/l of ferric nitrate (as Fe $(NO_3)_3$ $9H_2O$) and from about 1 to about 30 g/l of anthranilic acid.

3. The composition of claim 2, wherein said aqueous solution comprises about 200 ml/l of nitric acid, about 80 g/l ferric nitrate and about 10 g/l anthranilic acid.

4. The composition of claim 2 wherein said aqueous solution comprises about 300 ml/l of nitric acid, about 140 g/l ferric nitrate and about 10 g/l anthranilic acid.

5. The composition of claim 1 further comprising a surfactant.

6. The composition of claim 5, wherein said surfactant comprises from about 0.1 to about 5.0 g/l of cocoamine and from about 0.1 to about 5.0 g/l of an ethoxylated fatty alcohol nonionic surfactant.

7. The composition of claim 5, wherein said surfactant comprises about 0.37 g/l of cocoamine and about 0.64 g/l of an ethoxylated fatty alcohol non-ionic surfactant.

8. The composition of claim 5, wherein said surfactant comprises a phosphate ester and/or an ethylene oxide/propylene oxide copolymer.

9. The composition of claim 8 comprising about 3 g/l of a blend of phosphate ester and ethylene oxide/propylene oxide copolymer.

10. A method of stripping a layer of a metal selected from the group consisting of tin, lead, tin-lead alloy and tin-copper alloy from the surface of a copper substrate which comprises applying to said layer to be stripped the composition of claim 1.

11. The method of claim 10 wherein said method is a method for stripping a layer of solder and a layer of tin-copper alloy underlying said solder from a copper substrate of a printed circuit board.

12. A method according to claim 10 in which said composition is applied by spraying.

13. A method according to claim 11 in which said composition is applied by spraying.

* * * * *